United States Patent [19]

Ghoshal

[11] Patent Number: 5,162,746

[45] Date of Patent: Nov. 10, 1992

[54] DIGITALLY CONTROLLED CRYSTAL-BASED JITTER ATTENUATOR

[75] Inventor: Sajol C. Ghoshal, Orangevale, Calif.

[73] Assignee: Level One Communications, Inc., Folsom, Calif.

[21] Appl. No.: 563,507

[22] Filed: Aug. 7, 1990

Related U.S. Application Data

[63] Continuation-in-part of Ser. No. 382,258, Jul. 19, 1989, Pat. No. 5,077,529.

[51] Int. Cl.$^5$ .................. H03L 7/00; H03D 13/00
[52] U.S. Cl. ........................... 328/155; 328/133; 307/262; 307/271; 331/158; 331/179; 375/118; 375/119; 375/120
[58] Field of Search ............... 307/262, 271; 328/155, 328/133, 61; 331/14, 158, 179; 375/118, 119, 120

[56] References Cited

U.S. PATENT DOCUMENTS

| | | | |
|---|---|---|---|
| 3,731,219 | 5/1973 | Mader et al. | 331/14 |
| 3,815,042 | 6/1974 | Maunsell et al. | 331/1 A |
| 4,179,671 | 12/1979 | Yoshida et al. | 331/179 |
| 4,270,183 | 5/1981 | Robinson et al. | 364/900 |
| 4,360,788 | 11/1982 | Erps et al. | 331/1 A |
| 4,449,250 | 5/1984 | Kurby | 331/1 A |
| 4,456,890 | 6/1984 | Carickhoff | 375/120 |
| 4,468,634 | 8/1984 | Takagi et al. | 331/158 |
| 4,495,473 | 1/1985 | Treise | 375/120 |
| 4,583,059 | 4/1986 | Konno | 331/179 |
| 4,626,798 | 12/1986 | Fried | 331/1 A |
| 4,639,687 | 1/1987 | Scholz | 331/1 A |
| 4,694,259 | 9/1987 | Carickhoff et al. | 375/120 |
| 4,780,759 | 10/1988 | Matsushima et al. | 375/120 |
| 4,831,338 | 5/1989 | Yamaguchi | 375/120 |
| 4,906,941 | 3/1990 | Kato et al. | 375/120 |
| 4,941,156 | 7/1990 | Stern et al. | 375/118 |
| 4,972,442 | 11/1990 | Steierman | 375/120 |

OTHER PUBLICATIONS

IEEE Standard Dictionary of Electrical and Eletronic Terms; Jul. 20, 1984; p. 149.

Primary Examiner—Janice A. Howell
Assistant Examiner—Terry D. Cunningham
Attorney, Agent, or Firm—Merchant, Gould, Smith, Edell, Welter & Schmidt

[57] ABSTRACT

A circuit for attenuating phase jitter on an incoming clock signal includes a digitally controlled oscillator, a phase lock loop including a phase detector, and a dithering circuit. The oscillator is capable of generating N discrete frequencies selectable through digitally controlled inputs controlling switched, capacitively-loaded amplifier stages. The phase lock loop provides a total of $C \times N \times NB$ frequencies. The phase detector consists primarily of an up/down counter with an overflow-/underflow limiter circuit. The dithering circuit modulates the oscillator signal to reduce inadequate rejection behavior when the incoming clock frequency is substantially the same as one of the N selectable frequencies of the oscillator divided down to match the frequency of the incoming clock.

6 Claims, 7 Drawing Sheets

| INPUT 4 BIT BUS 42 | OUTPUT N BIT BUS 46 | | | | | | | | | | | | | | |
|---|---|---|---|---|---|---|---|---|---|---|---|---|---|---|---|
| | AMP_1 | AMP_2 | AMP_3 | AMP_4 | AMP_5 | AMP_6 | AMP_7 | AMP_8 | AMP_9 | AMP_10 | AMP_11 | AMP_12 | AMP_13 | AMP_14 | AMP_15 |
| 0000 | 0 | 0 | 0 | 0 | 0 | 0 | 0 | 0 | 0 | 0 | 0 | 0 | 0 | 0 | 0 |
| 0001 | 1 | 0 | 0 | 0 | 0 | 0 | 0 | 0 | 0 | 0 | 0 | 0 | 0 | 0 | 0 |
| 0010 | 1 | 1 | 0 | 0 | 0 | 0 | 0 | 0 | 0 | 0 | 0 | 0 | 0 | 0 | 0 |
| 0011 | 1 | 1 | 1 | 0 | 0 | 0 | 0 | 0 | 0 | 0 | 0 | 0 | 0 | 0 | 0 |
| 0100 | 1 | 1 | 1 | 1 | 0 | 0 | 0 | 0 | 0 | 0 | 0 | 0 | 0 | 0 | 0 |
| 0101 | 1 | 1 | 1 | 1 | 1 | 0 | 0 | 0 | 0 | 0 | 0 | 0 | 0 | 0 | 0 |
| 0110 | 1 | 1 | 1 | 1 | 1 | 1 | 0 | 0 | 0 | 0 | 0 | 0 | 0 | 0 | 0 |
| 0111 | 1 | 1 | 1 | 1 | 1 | 1 | 1 | 0 | 0 | 0 | 0 | 0 | 0 | 0 | 0 |
| 1000 | 1 | 1 | 1 | 1 | 1 | 1 | 1 | 1 | 0 | 0 | 0 | 0 | 0 | 0 | 0 |
| 1001 | 1 | 1 | 1 | 1 | 1 | 1 | 1 | 1 | 1 | 0 | 0 | 0 | 0 | 0 | 0 |
| 1010 | 1 | 1 | 1 | 1 | 1 | 1 | 1 | 1 | 1 | 1 | 0 | 0 | 0 | 0 | 0 |
| 1011 | 1 | 1 | 1 | 1 | 1 | 1 | 1 | 1 | 1 | 1 | 1 | 0 | 0 | 0 | 0 |
| 1100 | 1 | 1 | 1 | 1 | 1 | 1 | 1 | 1 | 1 | 1 | 1 | 1 | 0 | 0 | 0 |
| 1101 | 1 | 1 | 1 | 1 | 1 | 1 | 1 | 1 | 1 | 1 | 1 | 1 | 1 | 0 | 0 |
| 1110 | 1 | 1 | 1 | 1 | 1 | 1 | 1 | 1 | 1 | 1 | 1 | 1 | 1 | 1 | 0 |
| 1111 | 1 | 1 | 1 | 1 | 1 | 1 | 1 | 1 | 1 | 1 | 1 | 1 | 1 | 1 | 1 |

DIGITALLY CONTROLLED CRYSTAL-BASED JITTER ATTENUATOR

BACKGROUND OF THE INVENTION

1. Cross-Reference To Related Application

This application is a continuation-in-part of application Ser. No. 07/382,258 filed Jul. 19, 1989 by Sajol Ghoshal et al. entitled "WIDE BANDWIDTH DIGITAL PHASE LOCKED LOOP WITH REDUCED LOW FREQUENCY INTRINSIC JITTER", now U.S. Pat. No. 5,077,529, issued Dec. 31, 1991, which application is incorporated herein by reference.

2. Field of the Invention

This invention relates in general to jitter attenuators, and in particular, to a jitter attenuator circuit comprising a first order loop having an up/down counter and switched, capacitively-loaded amplifier stages for changing the frequency of a crystal oscillator.

3. Description of Related Art

Jitter attenuator circuits are well known for absorbing phase variations from signals. If these phase variations are not eliminated they can cause significant errors in digital systems.

In a typical prior art jitter attenuator circuit, a crystal-controlled oscillator is controlled with switched capacitors, which are switched in quantized steps that change the frequency. The phase difference between the read clock and the write clock is determined by a digital phase detector, typically comprised of a write counter, read counter and an adder, which outputs a digital phase difference value. The difference value is decoded to generate control signals to determine which of the switched capacitors are selected for the oscillator.

Whatever the merits of prior jitter attenuators, they do not achieve the benefits of the present invention.

SUMMARY OF THE INVENTION

To overcome the limitations in the prior art described above, and to overcome other limitations that will become apparent upon reading and understanding the present specification, the present invention discloses a jitter attenuator circuit for attenuating phase jitter on an incoming clock signal. The jitter attenuator circuit is comprised of a digitally controlled oscillator, a phase lock loop, and a dithering circuit.

The oscillator generates an oscillator signal at one of N selectable frequencies. The frequency is selected by digitally controlled inputs. The oscillator consists of a crystal oscillator having switched, capacitively-loaded amplifier stages. The oscillator is changed from its nominal frequency by adding or removing amplifier stages. The amplifier stages change the load capacitance of the oscillator crystal, thereby changing the frequency of the oscillator signal. Each amplifier stage includes at least one amplifier to provide sufficient gain to sustain the oscillations by the oscillator.

The phase lock loop, which includes a phase detector, selects one of the N selectable frequencies of the oscillator based on a phase relationship between a divided incoming signal and a divided oscillator clock. The phase lock loop provides a total number $T_F$ of selectable frequencies:

$$T_F = C \times NB \times N$$

and a selectable resolution R with regard to the frequency of the oscillator signal:

$$R = \frac{1}{(C \times NB)}$$

wherein C is a first selectable divisor used to divide the frequency of the oscillator signal so that it matches the frequency of the incoming signal, and NB is a second selectable divisor used to divide the frequency of the incoming signal and the frequency of the divided oscillator signal before the phase relationship therebetween is determined. The phase lock loop thus provides an average frequency $F_{avg}$:

$$F_{avg} = R \sum_{i=1}^{C \times NB} f_i$$

wherein $f_i$ is a frequency selected from the N selectable frequencies of the oscillator for each period of the divided oscillator signal.

The phase detector determines the phase error between the divided incoming clock and the divided oscillator signal, and provides a digital output proportional thereto. The output is used to select one of the N selectable frequencies of the oscillator. The phase detector consists of an up/down counter, which includes an overflow and underflow limiter circuit to prevent rollovers. The up/down counter is incremented or decremented depending on the out-of-phase relationship between the divided incoming clock and the divided oscillator signal.

The dithering circuit frequency modulates the oscillator to reduce inadequate rejection behavior and eliminate jitter enhancement when the frequency of the incoming clock is substantially the same as one of the N selectable frequencies of the oscillator divided down to match the frequency of the incoming clock. The dithering circuit is comprised of at least one switched, capacitively-loaded amplifier stage which changes the load capacitance of the oscillator and at least one dither signal for alternately activating and de-activating the switched, capacitively-loaded amplifier stages at predetermined intervals, thereby preventing the oscillator from locking at one of the N selectable frequencies.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

The present invention discloses a jitter attenuator circuit for attenuating phase jitter on an incoming digital clock signal. The circuit is designed for use in DSX-1 (1.544 Mbps) or CEPT (2.048 Mbps) transceivers. The jitter attenuator circuit is comprised of a digitally controlled oscillator, a phase lock loop, and a dithering circuit.

The oscillator generates an oscillator signal at one of N selectable frequencies. The frequency is selected by digitally controlled inputs. The oscillator consists of a crystal oscillator having switched, capacitively-loaded amplifier stages. The oscillator is changed from its nominal frequency by adding or removing amplifier stages. The amplifier stages change the load capacitance of the crystal, thereby changing the frequency of the oscillator signal. Each amplifier stage includes at least one amplifier to provide sufficient gain to sustain the oscillations by the oscillator. The gain of the amplifier stage is determined by maintaining the same gain-bandwidth product for each set of capacitively-loaded amplifier stages.

In the preferred embodiment, the number N of selectable frequencies is determined by the amount of allowable intrinsic jitter in the oscillator signal and by minimizing the effect of transients on the oscillator when the load is changed. Further, in the preferred embodiment, the pull range of the oscillator is designed to handle a worst case frequency offset for the input clock ($\pm 130$ ppm) and a nominal frequency accuracy of the crystal ($\pm 50$ ppm). Thus, the worst case pull range of the oscillator is at least $\pm 180$ ppm.

The phase lock loop, which includes a phase detector, selects one of the N selectable frequencies of the oscillator based on a phase relationship between a divided incoming signal and a divided oscillator clock. The phase lock loop provides a total number $T_F$ of selectable frequencies:

$$T_F C \times NB \times N$$

and a selectable resolution R with regard to the frequency of the oscillator signal:

$$R = \frac{1}{(C \times NB)}$$

wherein C is a first selectable divisor used to divide the frequency of the oscillator signal so that it matches the frequency of the incoming signal, and NB is a second selectable divisor used to divide the frequency of the incoming signal and the frequency of the divided oscillator signal before the phase relationship therebetween is determined. The phase lock loop thus provides an average frequency $F_{avg}$:

$$F_{avg} = R \sum_{i=1}^{C \times NB} f_i$$

wherein $f_i$ is a frequency selected from the N selectable frequencies of the oscillator for each period of the divided oscillator signal.

In the preferred embodiment, the circuit has a bandwidth of less than 10 Hz and provides for jitter rejection at the rate of $-20$ dB/dec after 10 Hz. The low bandwidth requirement and the low intrinsic jitter specifications promoted the design of the phase locked loop to control the oscillator.

The phase detector determines the phase error between the divided incoming clock and the divided oscillator signal, and provides a digital output proportional thereto. The output is used to select one of the N selectable frequencies of the oscillator. The phase detector consists of an up/down counter, which includes an overflow and underflow limiter circuit to prevent rollovers. The up/down counter is incremented or decremented depending on the out-of-phase relationship between the divided incoming clock and the divided oscillator signal.

The dithering circuit frequency modulates the oscillator to reduce inadequate rejection behavior and eliminate jitter enhancement when the frequency of the incoming clock is substantially the same as one of the N selectable frequencies of the oscillator divided down to match the frequency of the incoming clock. The dithering circuit is comprised of at least one switched, capacitively-loaded amplifier stage which changes the load capacitance of the oscillator and at least one dither signal for alternately activating and de-activating the switched, capacitively-loaded amplifier stages at predetermined intervals, thereby preventing the oscillator from locking at one of the N selectable frequencies.

Figure 1:
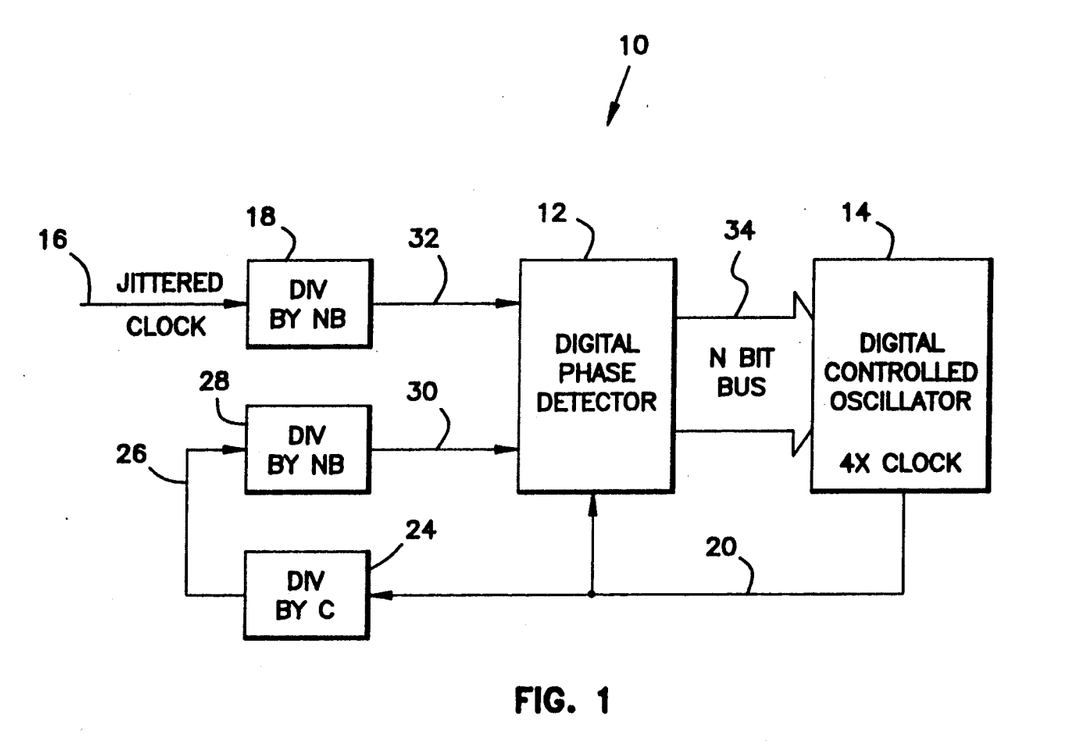
FIG. 1 is a block diagram describing the jitter attenuator circuit of the present invention.

Refer now to FIG. 1, which is a block diagram describing the components of the jitter attenuator circuit 10 of the present invention. The jitter attenuator circuit 10 operates as a first order loop consisting of a digital phase detector 12 driving a multi-frequency, digitally controlled, crystal oscillator 14. In the preferred embodiment, the oscillator 14 generates a 4×clock signal 20, which has a frequency multiplier of four times that of the incoming clock 16. Signal 20 clocks the circuit 10, so the frequency multiplier therefor is preferably selectable so as to provide a selectable resolution for the circuit 10.

The 4×clock signal 20 from the oscillator 14 is divided down by a divider 24 to produce a 1×clock signal 26, which is the output of the circuit 10. The incoming clock 16 and the 1×clock signal 26 are both divided down, by dividers 18 and 28 respectively, to achieve a desired bandwidth. The dividers 18, 24, and 28 are preferably selectable so as to provide a selectable resolution, in conjunction with the clock signal 20. The dividers also determine the bandwidth of the circuit 10. For example, a divide by 2 (NB=2) at dividers 18 and 28 produces a 6 Hz bandwidth (in conjunction with a divide by 4 at divider 24), and a divide by 4 (C=4) at dividers 18 and 28 produces a 3 Hz bandwidth (in conjunction with a divide by 4 at divider 24).

Once divided, signals 30 and 32 are input to the digital phase detector 12. The function of the phase detector 12 is to compare the phase relationship of the two input signals 30 and 32, and produce a digital output signal 34 proportional to the phase difference of the two input signals 30 and 32. The output signal 34 is monotonic with a limiter at the top and bottom of its range, thus preventing rollover.

Figure 2:
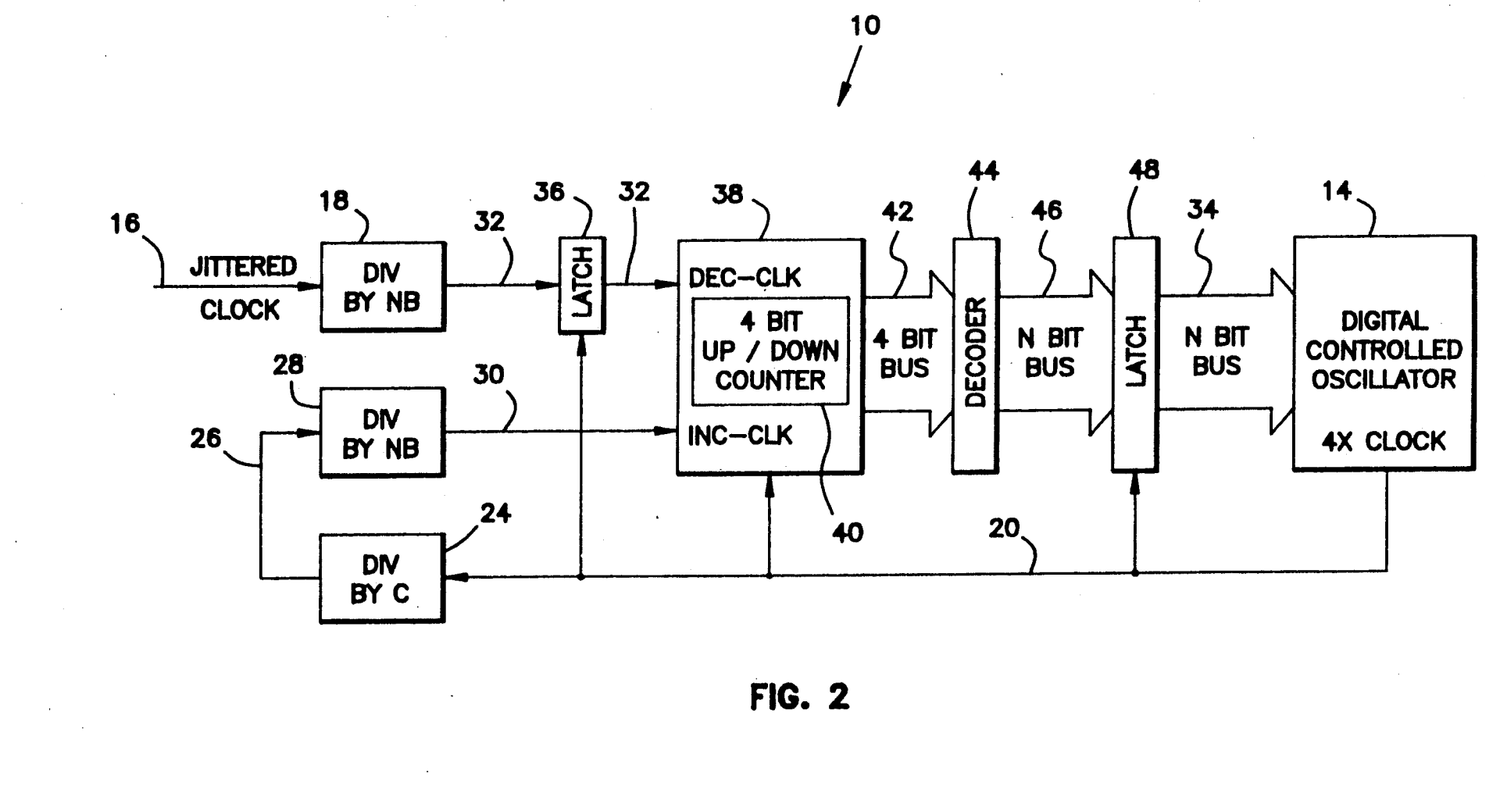
FIG. 2 is a block diagram describing the phase detector of the jitter attenuator circuit.

Refer now to FIG. 2, which is a block diagram describing in more detail the component parts of the phase detector 12. The phase detector 12 consists of a latch 36, a counter circuit 38 having a 4-bit up/down counter 40, a 4-bit bus 42, a decoder 44, an N-bit bus 46, and a latch 48. The latch 36, counter circuit 38, and latch 48 are synchronized to the 4×clock signal 20.

The counter circuit 38 acts as a phase-frequency detector with no aliasing or rollover. The counter circuit 38 is incremented by the rising edge of signal 30 and decremented by the rising edge of signal 32. Thus, the counter circuit 38 produces an output 42 proportional to the phase difference of the two input signals 30 and 32. As the output 42 of the counter circuit 38 increases, switched, capacitively-loaded amplifiers (discussed below) are added to the oscillator 14, thereby reducing its frequency.

Figure 3:
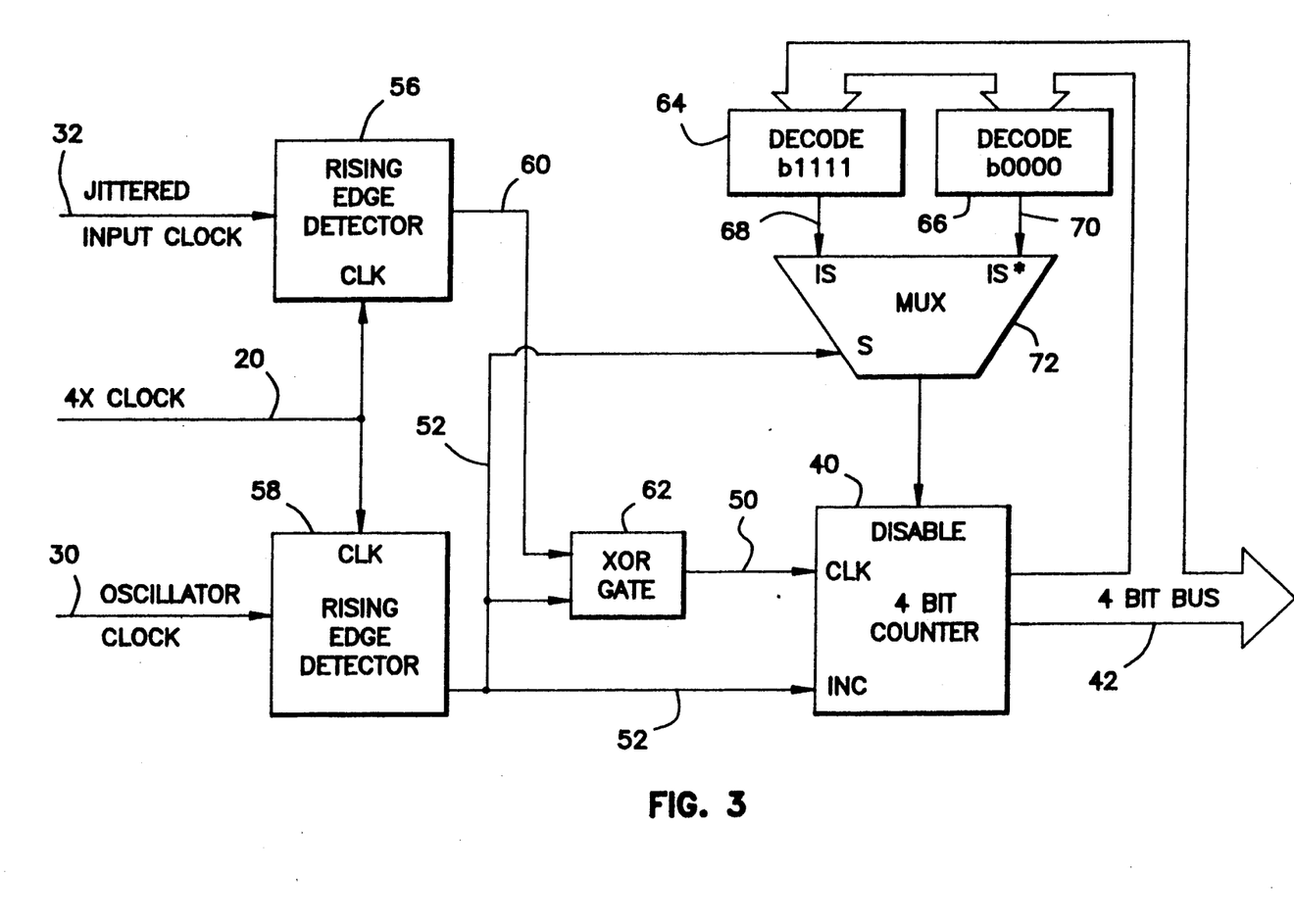
FIG. 3 is a block diagram describing the up/down counter of the phase detector.

FIG. 3 is a block diagram describing the counter circuit 38. The 4-bit up/down counter 40 therein has clock 50, increment 52, and disable 54 inputs. The 4-bit up/down counter 40 increments upon the simultaneous receipt of a clock input 50 of "1" and an increment input 52 of "1". The 4-bit up/down counter 40 decrements upon the simultaneous receipt of a clock input 50 of "1" and an increment input 52 of "0". In the preferred embodiment, the counter circuit 38 ranges in value from 0 to 15, although other ranges could be substituted therefor.

Rising edge detectors 56 and 58 produce pulses for each cycle of the 4×clock signal 20, if rising edges are detected on input signals 32 and 30, respectively. Thus, the resolution of the phase detector 12 with respect to the incoming clock signal 16 is 1/C, where C is the selectable divider 24 (e.g., C=4). The respective outputs 60 and 52 of both rising edge detectors 56 and 58 are XORed at gate 62 to produce the clock pulse 50 for the 4-bit up/down counter 40. Thus, when the incoming signals 30 and 32 are in phase, the XOR gate 62 produces no clock pulse 50; when signals 32 and 30 are out of phase, the XOR gate 62 produces a clock pulse 50. If signals 32 and 30 are out of phase because a rising edge was detected on signal 30 but not on signal 32, then the 4-bit up/down counter 40 increments. If signals 32 and 30 are out of phase because a rising edge was detected on signal 32 but not on signal 30, then the 4-bit up/down counter 40 decrements.

The 4-bit up/down counter 40 is clamped to prevent rollover when an all ones pattern or all zeros pattern is detected by decoders 64 and 66, respectively. The outputs 68 and 70 of the decoders 64 and 66 enter a multiplexor 72. The increment signal 52 is input to the multiplexor 72 to select one of the outputs 68 or 70. If the output 68 of the decoder 64 is all ones, then the 4-bit up/down counter 38 is prevented from incrementing further. Similarly, if the output 70 of the decoder 66 is all zeros, then the 4-bit up/down counter 38 is prevented from decrementing further.

Figure 4:
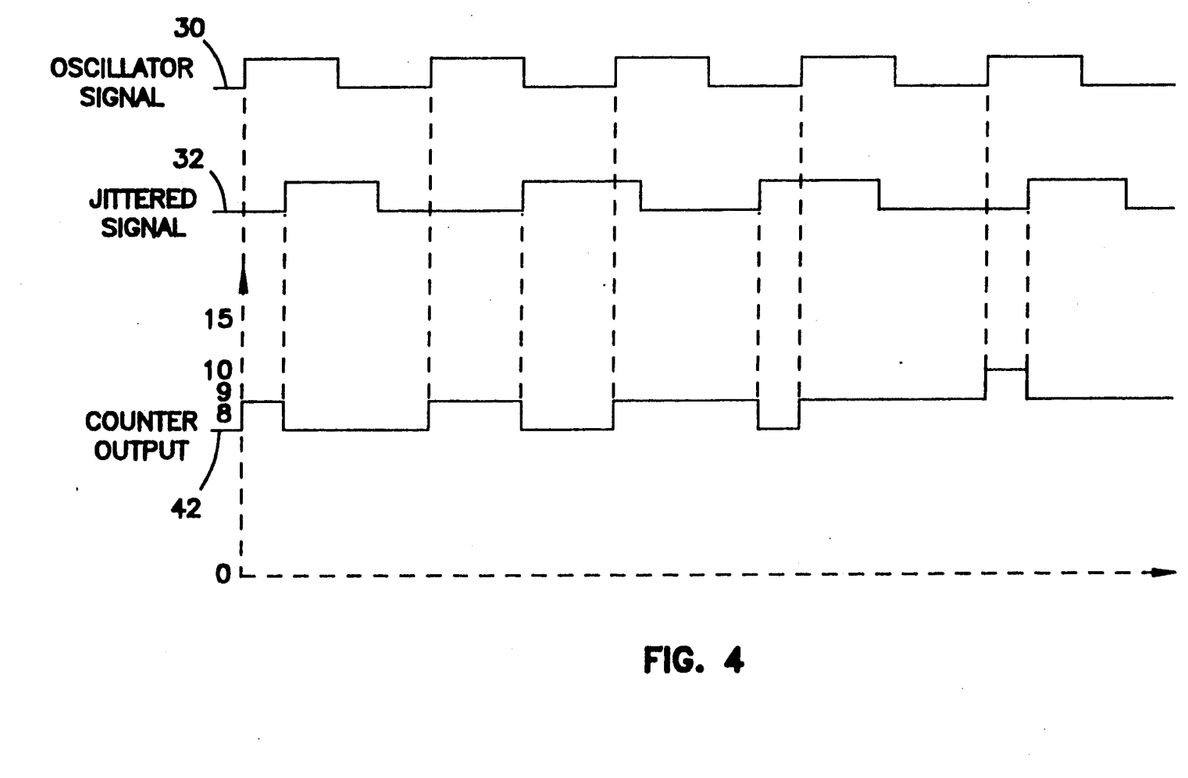
FIG. 4 is a timing chart describing the output of the up/down counter.

FIG. 4 is a timing chart illustrating an example of the output 42 from the counter circuit 38. Reading the timing chart from left to right, the output 42 of the counter circuit 38 is initially at 8. Each of the leading edges of signals 30 and 32 are out of phase, thus causing the counter circuit 38 to increment and decrement accordingly. The first three occurrences of the leading edge of signal 30 causes the counter circuit 38 to increment to 9. Each of these occurrences is followed by the leading edge of signal 32 which causes the counter circuit 38 to decrement back to 8 each time. The fourth and fifth occurrences of the leading edge of signal 30 occur before the fourth occurrence of the leading edge of signal 32, and thus the counter circuit 38 increments to 9 and then to 10. The fourth occurrence of the leading edge of signal 32 causes the counter circuit 38 to decrement only to 9. Thus, the output 42 stays at 9 longer as the phase difference between signals 30 and 32 becomes larger. When the phase difference of signals 30 and 32 exceeds one cycle of the signal 32, i.e., the fourth and fifth occurrences of the leading edges of signals 30, the counter circuit 38 increments to 10, and thereafter pulses between 9 and 10. Further, as mentioned above, when the counter circuit 38 reaches the bounds of its range, i.e., 15 or 0, the output 42 is clamped so that the counter circuit 38 does not rollover after multiple $2\pi$ radians of phase difference between the signals 30 and 32. The counter circuit 38 normally stays at a value of 8, thus providing $\pm 14$ ($7 \times 2$) $2\pi$ radians of range.

The period of the output 34 of the phase detector 12 is determined by the number of dividers in the loop, i.e., C×NB, where C is the selectable divider 24 (e.g., C=4) and NB is the selectable dividers 18 and 24 (e.g., NB=2 for 6 Hz and NB=4 for 3 Hz). In the preferred embodiment, if a 6 Hz bandwidth is desired, then C=4, NB=2, and the period of the output 34 of the phase detector 12 is 8 (4×2) cycles of the oscillator 14. The phase detector 12 is clocked by the 4×clock signal 20 at 0.25 unit intervals of the incoming clock signal 16. Thus, the output 34 is only generated if the phase difference between the two signals 30 and 32 is greater than 0.25 unit intervals, i.e., one cycle of the oscillator 14.

The circuit 10 thus operates by allowing the inputs 30 and 32 to the phase detector 12 to be split by an integer number of cycles of the oscillator 14. This is, in effect, the boundary for adjustments of the oscillator 14. If the phase difference should fall below an integer number of oscillator 14 cycles, the counter circuit 38 increments or decrements to correct for the phase error. Therefore, between any two discrete frequencies of the oscillator 14, the phase detector 12 can provide a resolution R of:

$$\frac{1}{(C \times NB)}$$

where C is the selectable divider 24 (e.g., C=4) and NB is the selectable dividers 18 and 24 (e.g., NB=2 for 6 Hz and NB=4 for 3 Hz). Further, the circuit 10 provides a total number $T_F$ of selectable frequencies:

$$T_F = C \times NB \times N$$

and an average frequency $F_{avg}$:

$$F_{avg} = R \sum_{i=1}^{C \times NB} f_i$$

where C is the selectable divider 24 (e.g., C=4), NB is the selectable dividers 18 and 24 (e.g., NB=2 for 6 Hz and NB=4 for 3 Hz), N is the number of selectable frequencies of the oscillator 14, and $f_i$ is the frequency selected from the N selectable frequencies of the oscillator 14 for each period of the divided oscillator clock 30.

For example, in the preferred embodiment, if C=4, NB=2, and N=15, then the total frequencies $T_F$ is 120. Further, if the phase detector 12 selects frequency $f_1$ for one oscillation cycle and then increases to frequency $f_2$ for seven oscillator cycles, then the average frequency $F_{avg}$ of the circuit 10 is:

$$F_{avg} = \frac{1 \times f_1 + 7 \times f_2}{8}$$

In the absence of jitter in the incoming clock signal 16, and in the presence of frequency offset between the signals 30 and 32, the counter circuit 38 holds a value which keeps the oscillator 14 at the frequency closest to the frequency of the incoming clock signal 16 and jumps back and forth between the two frequencies bounding (i.e., greater than and less than) the frequency of the incoming clock signal 16.

In the absence of jitter in the incoming clock signal 16, and when the counter circuit 38 is not close to the average frequency position for the oscillator 14, the oscillator 14 allows the phase of the 4×clock signal 20 to slip with respect to the incoming clock signal 16 in a effort to increment or decrement the counter circuit 38, thereby driving it towards the average frequency position closest to the average frequency of the incoming clock signal 16. Once it reaches that position, the oscillator 14 stays there, beating between two positions to maintain the correct average frequency.

Figure 5A:
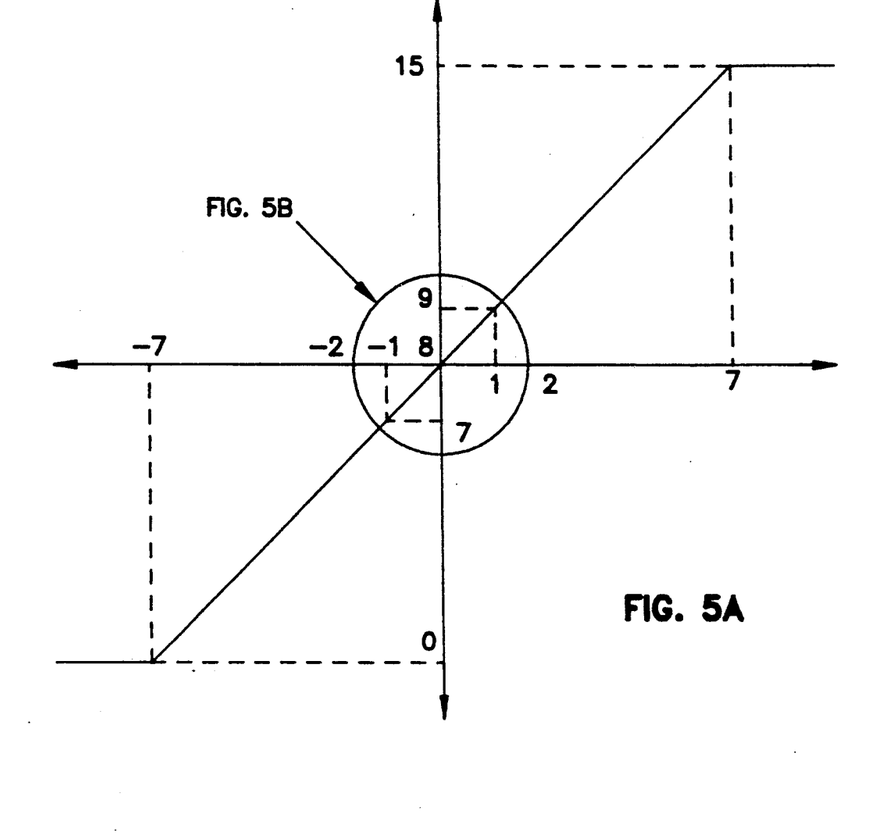
FIGS. 5a and 5b combined are a graph describing the relationship between the output of the phase detector and the divided clock signal from the oscillator.
Figure 5B:
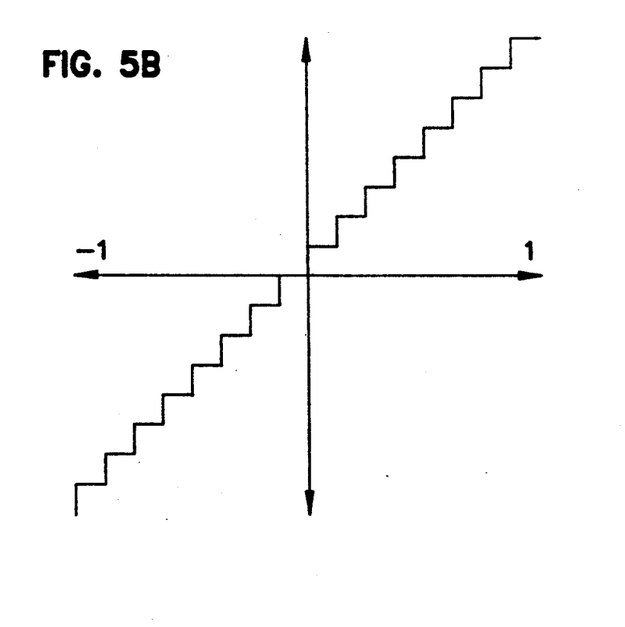

FIGS. 5a and 5b combined are a graph describing the relationship between the output 34 of the phase detector 12 and the divided clock signal 30 from the oscillator 14. The Y-axis indicates the value of the output 34 of the phase detector 12; the X-axis indicates the phase difference of the signals 30 and 32; and the origin of the graph occurs at a value of 8 for the output 34 and 0 for the phase difference. The line at a 45 degree angle through the origin describes the behavior of the output 34 as the phase difference changes. FIG. 5b is an enlarged view of a portion of FIG. 5a, showing the staircase effect on the output 34 as the phase difference increases or decreases. FIG. 5b illustrates that the phase detector 12 can resolve less than one cycle (or $2\pi$ radians) of phase difference. The resolution in FIG. 5B is $\frac{1}{8}$th of a cycle of the divided incoming clock signal 16, i.e., 1/(C×NB).

If the phase difference increases to 1, the output 34 increases from the nominal value of 8 to a value of 9. As the phase difference increases to 7, the output 34 increments in value until it eventually reaches a value of 15, where, as indicated by the horizontal line, it is clamped to prevent overflows.

When the phase difference decreases to −1, the output 34 decreases to a value of 7. As the phase difference decreases to −7, the output 34 decrease to a value of 0, where, as indicated by the horizontal line, it is clamped to prevent underflows.

Referring again to FIG. 2, the oscillator 14 can generate N different frequencies, which extend across the entire frequency pull range of the device. Selection of the N different frequencies are controlled by the decoder 44 which feeds N-bit bus 46, latch 48, and N-bit bus 34. Each line of the N-bit bus 34 turns on a switched, capacitively-loaded amplifier stage in the oscillator 14.

Figure 6:
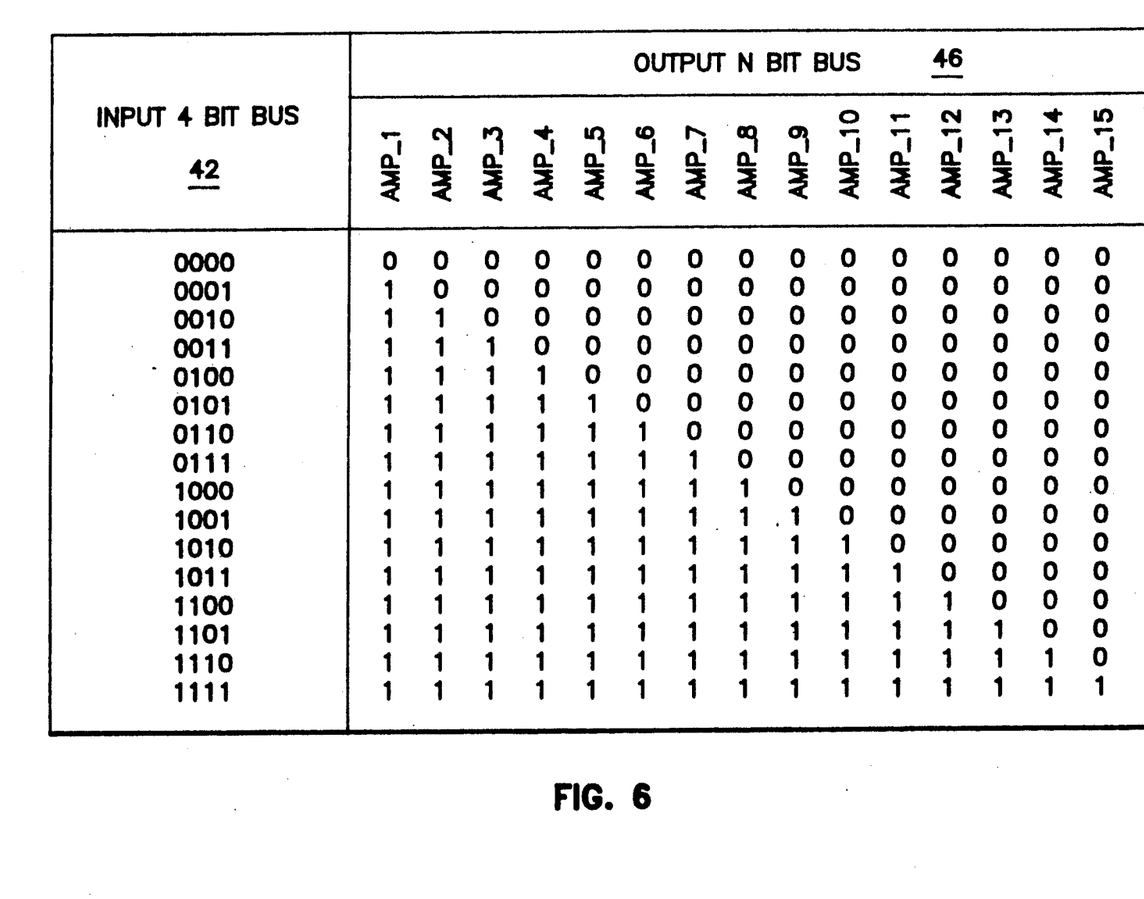
FIG. 6 is a state diagram describing the output from the decoder.

FIG. 6 is a state diagram for the decoder 44. A "1" indicates that the amplifier stage is ON, while a "0" indicates that the amplifier stage is OFF. If the input to the decoder 44 is a binary value "n", then "n" outputs are turned on. For example, if the input is binary 0, no output is turned on; if the input is binary 15, then 15 outputs are turned on.

Figure 7:
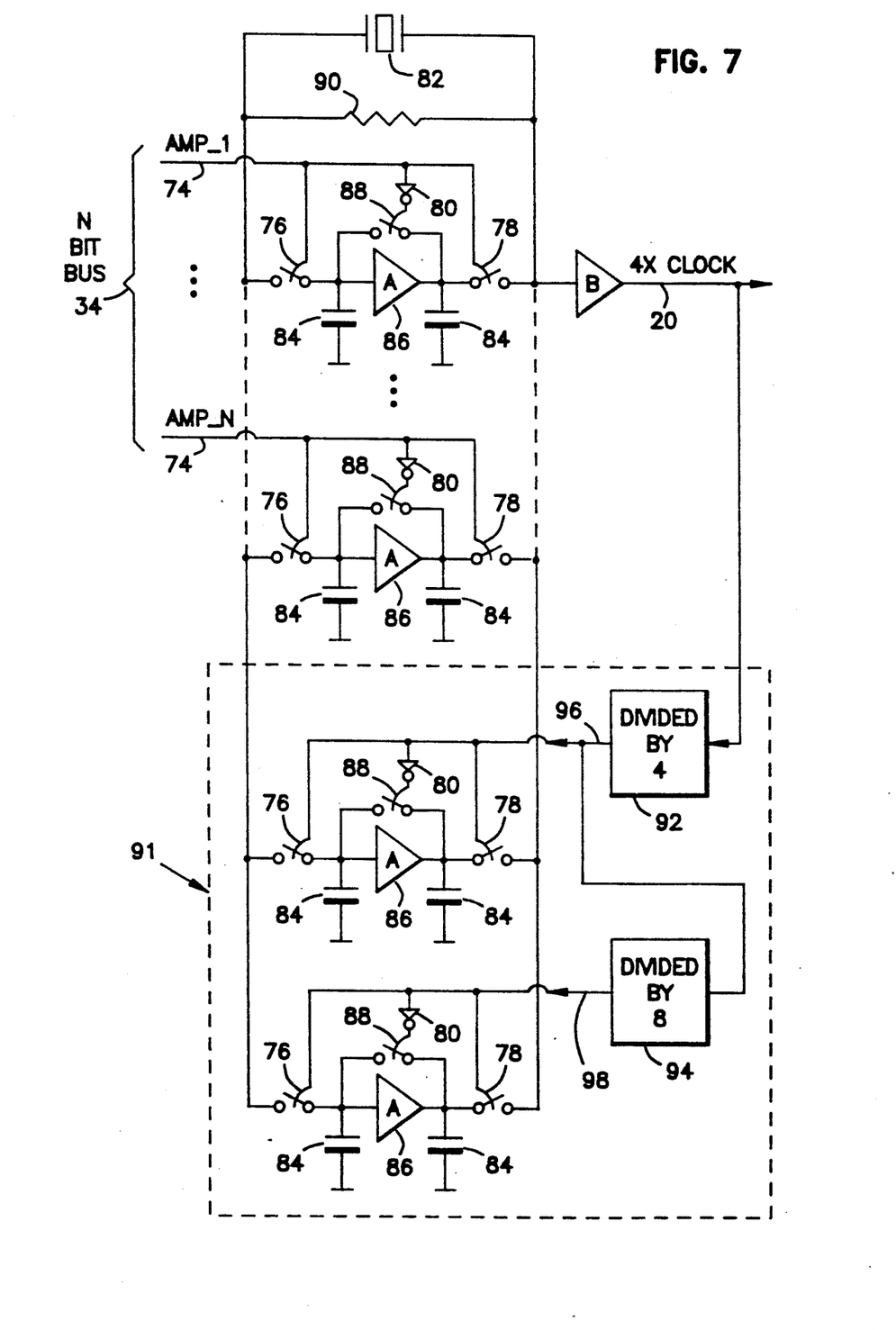
FIG. 7 is a schematic diagram describing the switched, capacitively-loaded amplifier stages that change the frequency of oscillation.

FIG. 7 is a schematic diagram illustrating the oscillator 14, and more specifically, the switched, capacitively-loaded amplifier stages which change the frequency of oscillation. The N amplifier stages controlled by the output 34 of the phase detector 12 are described in FIG. 7, although only amplifier stages #1 and #N are illustrated for the sake of clarity. Each control signal 74 is part of the N-bit bus 34. Each amplifier stage consists of switches 76 and 78 to connect the amplifier stage to a crystal 82, an inverter 80 to invert the control signal 74 to switch 88, capacitors 84 to change the load on the crystal 82, an amplifier 86 to maintain adequate gain, and a switch 88 to connect the amplifier 86 input to its output when it is not connected to the crystal 82.

Whenever the switches 76 and 78 are closed, capacitors 84 and amplifiers 86 are added to the crystal 82 to change its frequency of oscillation. Sufficient gain must be maintained to sustain oscillations of the crystal 82. To sustain oscillations, a loop gain greater than one occurs when the phase margin through the loop is equal to zero, at the frequency of oscillation. The addition of the amplifiers 86 maintains the required gain to sustain the oscillations. The gain of the amplifiers 86 is adjusted to maintain the same gain-bandwidth product with different loading capacitors 84.

Since the bandwidth of the circuit 10 can be independently controlled by the input dividers 10 and 12 (i.e., the Divide by NB blocks in FIGS. 1 and 2), the number N of switched amplifier stages is determined from the criteria of minimizing the operating point transients suffered by the oscillator 14 when loads are switched. The smaller the load that capacitors 84 throw on the oscillator 14, the smaller the operating point transients suffered by the oscillator 14. Therefore, in the preferred embodiment, in order to minimize any operating point transients suffered by the oscillator 14, the number N of discrete frequencies defined for the oscillator is set to a number greater than one. Those skilled in the art will recognize that any number of frequencies could be used. Since the bandwidth of the circuit 10 should stay constant over the entire pull range of the oscillator 14, the change in frequency for each discrete frequency should be constant. This is achieved by adding capacitors 84 non-linearly according to the formula discussed below.

The following equations where used to estimate required capacitor values. Table 1 shows the calculated capacitor values. The frequency of oscillation is $w_a$ in radians/sec or $f_a$ in Hertz/sec. Thus:

$$w_a = \frac{1}{L_x C_x} + \frac{1}{L_x CL}$$

and:

$$f_a = f_s \sqrt{1 + \frac{C_x}{CL}}$$

where:

$$f_s = \sqrt{\frac{1}{L_x C_x}}$$

and $L_x$=crystal motional inductance, $C_x$=crystal motional capacitance, CL=crystal external load capacitance. The change in frequency of the oscillator 14 for a change in external load capacitance from CL1 to CL2 is:

$$delF(\text{ppm}) = 1.E6 \sqrt{\frac{1 + \frac{C_x}{CL1}}{1 + \frac{C_x}{CL2}}}$$

where $$CL2 = \frac{C_x}{\left(1 + \frac{delF}{1.E6}\right)^2 \left(1 + \frac{C_x}{CL1}\right) - 1}$$

FIG. 7 also illustrates a dithering circuit 91 which frequency modulates the oscillator 14 to provide improved rejection when the frequency of the incoming clock signal 16 is close to one of the N selectable frequencies of the oscillator 14 divided down to match the frequency of the incoming clock signal 16. Normally, if the frequencies are close, the counter circuit 38 stays at one value without pulsing. However, this changes the dynamic behavior of the oscillator 14, reducing its rejection performance. This problem is corrected by adding the dithering circuit 91 comprising the two switched amplifier stages shown at the bottom of FIG. 7. These switched amplifier stages are dithered by signals, for example, the 4×clock signal 20 divided down by 4 by divider 92 and divided down by 32 by dividers 92 and 94. The 1×clock signal 96 from divider 92 alternately turns on and off its associated amplifier stage. The ⅛×clock signal 98 from divider 94 alternately turns on and off its associated amplifier stage, although at less frequent intervals than the 1×clock signal 96. The dither added by these two amplifier stages prevents the oscillator 14 from locking onto one of the N selectable frequencies.

This concludes the description of the preferred embodiment of the invention. In summary, a jitter attenuator circuit has been described which accepts an incoming clock signal which has phase jitter on its edges and generates an oscillator clock signal which tracks the frequency of the incoming clock signal and reduces its jitter considerably, especially at high frequencies.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

TABLE 1

CAPACITOR VALUES
Cx = 0.017 pf CLtyp = 18.70 pf CLmin = 11.10 pf

| Discrete Frequencies | CLeff (pF) | Capacitors added (pF) | Frequency Deviation (ppm) | Amplifiers added |
|---|---|---|---|---|
| 1 | 11.69 | 1.17 | −38.44 272.45 | 1 |
| 2 | 12.36 | 1.35 | −39.69 232.76 | 1 |
| 3 | 13.10 | 1.47 | −38.50 194.26 | 1 |
| 4 | 13.92 | 1.64 | −38.30 155.96 | 1 |
| 5 | 14.86 | 1.88 | −38.58 117.38 | 1 |
| 6 | 15.95 | 2.17 | −38.94 78.44 | 1 |
| 7 | 17.21 | 2.53 | −39.08 39.36 | 2 |
| 8 | 18.68 | 2.94 | −38.80 0.56 | 2 |
| 9 | 20.41 | 3.47 | −38.60 −38.04 | 3 |
| 10 | 22.49 | 4.17 | −38.57 −76.61 | 4 |

TABLE 1-continued

CAPACITOR VALUES
Cx = 0.017 pf CLtyp = 18.70 pf CLmin = 11.10 pf

| Discrete Frequencies | CLeff (pF) | Capacitors added (pF) | Frequency Deviation (ppm) | Amplifiers added |
|---|---|---|---|---|
| 11 | 25.08 | 5.17 | −38.91 −115.52 | 5 |
| 12 | 28.31 | 6.46 | −38.65 −154.16 | 5 |
| 13 | 32.51 | 8.40 | −38.76 −192.92 | 9 |
| 14 | 38.18 | 11.34 | −38.79 −231.71 | 14 |
| 15 | 46.25 | 16.15 | −38.85 −270.56 | 22 |

Total amount of capacitance added to each crystal pin = 70.31 pF

What is claimed is:

1. A jitter attenuator circuit for attenuating phase jitter on an incoming signal, comprising:
   an oscillator for generating a clock signal at one of N selectable frequencies in response to a digital control signal;
   first divider means, having an input coupled to an output of the oscillator, for dividing the clock signal by a value C×NB;
   second divider means, having an input receiving the incoming signal, for dividing the incoming signal by the value NB;
   a phase detector, having a first input coupled to an output of the first divider means, a second input coupled to an output of the second divider means, and an output coupled to an input of the oscillator, for generating the digital control signal based on a phase relationship between the divided incoming signal and the divided clock signal, wherein the digital control signal selects a frequency $f_1$ for the clock signal from the N selectable frequencies of the oscillator;
   said oscillator comprising a dithering means for modulating the clock signal when the frequency of the divided incoming signal is substantially the same as the divided clock signal;
   the clock signal having a total number $T_F$ of selectable frequencies wherein:

$$T_F = (C \times NB) \times N$$

a selectable resolution R with regard to the frequency of the clock signal:

$$R = \frac{1}{C \times NB}$$

and an average frequency $F_{avg}$:

$$F_{avg} = R \sum_{i=1}^{C \times NB} f_i.$$

2. The jitter attenuator circuit of claim 1, wherein the dithering means comprises:
   at least one capacitively-loaded amplifier stage comprising an amplifier and one or more capacitors loading an input and output of the amplifier, wherein each stage has an input coupled to an input of a crystal through a first switch and an output coupled to an output of the crystal through a second switch; and
   means for activating and de-activating both the first and second switches at predetermined intervals, thereby activating and de-activating the capacitively-loaded amplifier stages to prevent the clock signal from locking at one of the N selectable frequencies.

3. The jitter attenuator circuit of claim 1, wherein the oscillator further comprises:
   a crystal;
   one or more capacitively-loaded amplifier stages comprising an amplifier and one or more capacitors loading an input and output of the amplifier, wherein each stage has an input coupled to an input of the crystal through a first switch and an output coupled to an output of the crystal through a second switch; and
   means for activating and de-activating both the first and second switches, thereby activating and de-activating the capacitively-loaded amplifier stages to alter the load capacitance on the crystal and change the frequency of the clock signal.

4. The jitter attenuator circuit of claim 3, wherein the digital control signal comprises an N-bit bus, and the means for activating and deactivating comprises means for activating a specified one of the capacitively-loaded amplifier stages whenever a corresponding bit of the N-bit bus is a logical 1, and for deactivating the specified one of the capacitively-loaded amplifier stages whenever the corresponding bit of the N-bit bus is a logical 0.

5. The jitter attenuator circuit of claim 1, wherein the phase detector comprises:
   an up/down counter for determining the phase relationship between the divided incoming signal and the divided clock signal, and for producing the digital control signal proportional thereto;
   means for incrementing and decrementing the up/down counter when the divided clock signal is out of phase with the divided incoming signal; and
   limiter means for disabling the up/down counter to prevent rollover when a count therein reaches a range boundary for the up/down counter.

6. A method of attentuating phase jitter on an incoming signal, comprising:
   generating a clock signal at one of N selectable frequencies in response to a digital control signal;
   dividing the clock signal by a value $C \times NB$;
   dividing the incoming signal by a value NB;
   detecting a phase relationship between the divided incoming signal and the divided clock signal;
   generating the digital control signal based on the detected phase relationship, wherein the digital control signal selects a frequency $f_i$ for the clock signal from the N selectable frequencies; and
   dithering the clock signal when the frequency of the divided incoming signal is substantially the same as the divided clock signal, thereby preventing the clock signal from locking at one of the N selectable frequencies;
   wherein the method provides a clock signal having a total number $T_F$ of selectable frequencies wherein:

$$T_F = (C \times NB) \times N$$

a selectable resolution R with regard to a frequency of the clock signal:

$$R = \frac{1}{C \times NB}$$

and an average frequency $F_{avg}$:

$$F_{avg} = R \sum_{i=1}^{C \times NB} f_i.$$

* * * * *

UNITED STATES PATENT AND TRADEMARK OFFICE
CERTIFICATE OF CORRECTION

PATENT NO. : 5,162,746
DATED : November 10, 1992
INVENTOR(S) : Sajol C. Ghoshal

It is certified that error appears in the above-identified patent and that said Letters Patent is hereby corrected as shown below:

Column 1, line 67, "$T_fC$" should read --$T_f=C$--. Column 3, line 52, "$T_fC$" should read --$T_f=C$--. Column 10, line 33, "$f_1$" should read --$f_i$--.

Signed and Sealed this

Nineteenth Day of October, 1993

Attest:

BRUCE LEHMAN

*Attesting Officer*  *Commissioner of Patents and Trademarks*